United States Patent
Philippens et al.

(10) Patent No.: US 7,620,087 B2
(45) Date of Patent: Nov. 17, 2009

(54) RADIATION-EMITTING SEMICONDUCTOR COMPONENT

(75) Inventors: Marc Philippens, Regensburg (DE); Tony Albrecht, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 142 days.

(21) Appl. No.: 11/047,833

(22) Filed: Jan. 31, 2005

(65) Prior Publication Data
US 2005/0207461 A1    Sep. 22, 2005

(30) Foreign Application Priority Data
Jan. 30, 2004 (DE) .................. 10 2004 004 781

(51) Int. Cl.
*H01S 5/00* (2006.01)
(52) U.S. Cl. .............. 372/50.1; 372/43.01; 372/50.121; 372/50.122; 372/50.124
(58) Field of Classification Search ... 372/50.1–50.124, 372/43.01
See application file for complete search history.

(56) References Cited

U.S. PATENT DOCUMENTS

| | | | |
|---|---|---|---|
| 5,212,707 A | | 5/1993 | Heidel et al. |
| 5,696,389 A | | 12/1997 | Ishikawa et al. |
| 5,708,280 A | | 1/1998 | Lebby et al. |
| 5,754,578 A | * | 5/1998 | Jayaraman .................. 372/50.1 |
| 5,914,976 A | * | 6/1999 | Jayaraman et al. ....... 372/50.21 |
| 5,995,529 A | | 11/1999 | Kurtz et al. |
| 6,088,376 A | * | 7/2000 | O'Brien et al. ........ 372/50.124 |
| 6,252,896 B1 | * | 6/2001 | Tan et al. .................. 372/50.11 |
| 6,434,180 B1 | * | 8/2002 | Cunningham ............... 372/50.1 |
| 6,483,862 B1 | * | 11/2002 | Aronson et al. .......... 372/50.21 |
| 6,771,680 B2 | * | 8/2004 | Bour et al. ................ 372/43.01 |
| 6,781,209 B1 | * | 8/2004 | Althaus et al. .............. 257/432 |
| 6,879,618 B2 | | 4/2005 | Cok et al. |
| 2002/0075929 A1 | * | 6/2002 | Cunningham ................. 372/50 |
| 2002/0146053 A1 | * | 10/2002 | Iwai ............................. 372/75 |
| 2002/0171088 A1 | * | 11/2002 | Kahen et al. ................... 257/88 |
| 2003/0058911 A1 | * | 3/2003 | Ebeling ........................ 372/50 |
| 2005/0089073 A1 | * | 4/2005 | Behringer et al. ............. 372/50 |

FOREIGN PATENT DOCUMENTS

| | | |
|---|---|---|
| DE | 100 57 698 A1 | 11/2000 |
| EP | 0 486 052 A1 | 11/1991 |
| EP | 1 249 903 | 10/2002 |

OTHER PUBLICATIONS

Examination Report dated Apr. 13, 2007 issued for corresponding European Patent Application No. 05 00 0425.
"Physics of Semiconductor Devices", Second Edition by S.M. Sze, chapter 12.4, pp. 704-705, Published in 1981.

* cited by examiner

*Primary Examiner*—Minsun Harvey
*Assistant Examiner*—Yuanda Zhang
(74) *Attorney, Agent, or Firm*—Cohen Pontani Lieberman & Pavane LLP

(57) ABSTRACT

A radiation-emitting semiconductor component comprising a semiconductor body (3) with a first active zone (1) and a second active zone (2) arranged above the first active zone, the first active zone being provided for generating a radiation having a first wavelength $\lambda_1$ (11) and the second active zone being provided for generating a radiation having a second wavelength $\lambda_2$ (22), the radiation having the first wavelength $\lambda_1$ being coherent and the radiation having the second wavelength $\lambda_2$ being incoherent.

22 Claims, 2 Drawing Sheets

RADIATION-EMITTING SEMICONDUCTOR COMPONENT

RELATED APPLICATIONS

This patent application claims the priority of German patent application no. 10 2004 004 781.2 dated Jan. 30, 2004, the disclosure content of which is hereby explicitly incorporated by reference into the present description.

FIELD OF THE INVENTION

The invention relates to a radiation-emitting semiconductor component

BACKGROUND OF THE INVENTION

Radiation-emitting semiconductor components of this type may be embodied for example as in U.S. application Ser. No. 10/432,187, as two or more edge emitting lasers arranged one above the other, the respective active zones emitting coherent radiation having the wavelength $\lambda_1$ and $\lambda_2$, respectively, during operation. Since the radiation power of coherent radiation having a specific wavelength is essentially emitted only along a main emission direction, an observer observing the radiation-emitting semiconductor component from a direction that deviates from the respective main emission direction of the radiations having the wavelength $\lambda_1$ and $\lambda_2$, respectively, often cannot decide, or can decide only with difficulty, whether or not the semiconductor component is emitting radiation at the observation instant. This holds true, in particular, if one of the wavelengths $\lambda_1$ and $\lambda_2$ lies in the non-visible spectral range.

Furthermore, EP 0 486 052 discloses a plurality of active zones which are arranged one above the other and are arranged in LED structures which emit incoherent radiation. However, a semiconductor component of this type is not suitable, or is only inadequately suitable, for applications which require high intensities of the kind that can be generated by means of lasers. However, the incoherent radiation generated by the LED chips can be detected by an observer in a relatively large solid angle range that encompasses the main emission direction. Said solid angle range may for example form an angle of 60° or more with the main emission direction of the semiconductor component.

SUMMARY OF THE INVENTION

One object of the present invention is to provide a radiation-emitting semiconductor component of the type mentioned above which emits coherent radiation during operation and whose operating state can be detected without any particular effort from an observation direction that deviates from the main emission direction of the coherent radiation.

This and other objects are attained in accordance with one aspect of the present invention directed to a radiation-emitting semiconductor component that comprises a semiconductor body with a first active zone and a second active zone arranged downstream of the first active zone in the vertical direction, the first active zone being provided for generating a radiation having a first wavelength $\lambda_1$, the second active zone being provided for generating a radiation having a second wavelength $\lambda_2$, and the radiation having the first wavelength $\lambda_1$ being coherent and the radiation having the second wavelength $\lambda_2$ being incoherent.

For the description of the invention as provided below, the terms "coherent" and "incoherent" are used with respect to radiation. If in the context of the invention there is any doubt as to what kind of radiation is coherent radiation and what kind of radiation is incoherent radiation, then laser radiation is to be regarded as coherent radiation and radiation that differs from a laser radiation and can be generated by semiconductors is to be regarded as incoherent radiation. Thus, when the semiconductor device produces some kind of radiation, this radiation is regarded as coherent, if it is laser radiation, and incoherent, if not.

This has the advantage that it is possible to observe the incoherent radiation having the wavelength $\lambda_2$ in a simplified manner compared with the coherent radiation having the wavelength $\lambda_1$ usually in a greater solid angle range and away from the main radiating direction. If, with regard to its operating state—the semiconductor component does or does not emit incoherent radiation—the incoherent radiation is coupled or can be coupled to the operating state of the coherent radiation, the incoherent radiation can be used as an indication of the operating state of the coherent radiation. It is thereby possible advantageously to avoid a direct observation of the coherent radiation in the main emission direction, which may have harmful effects on a human observer or measuring devices arranged in the beam path on account of high intensities, for example. Furthermore, a disturbing presence of an observer or of a measuring device in the beam path can be avoided.

In the context of the invention, the operating state of the incoherent and of the coherent radiation relates to the corresponding operating state of the semiconductor component that can emit coherent and/or incoherent radiation in the respective operating state. The operating states of the coherent and of the incoherent radiation may be independent of one another in this case.

The first active zone and the second active zone are preferably formed such that they are monolithically integrated in the semiconductor body, which can thus be produced in a continuous method, such as a continuous epitaxy process, for instance, preferably on a common growth substrate. This has the advantage that components of this type can be produced in a simplified manner. The second active zone can be produced with the first active zone in the course of producing the semiconductor body, e.g. by epitaxial growth, for monolithically integrating both active zones into a single semiconductor body. As a result, it is possible to avoid complicated subsequent mounting steps for arranging the second active zone on the first active zone. In the case of the invention, the second active zone does not have to be subsequently arranged above the first active zone since this can already take place during the production of the semiconductor body.

In a first preferred refinement of the invention, the first active zone is formed in a semiconductor structure comprising an optical resonator for generating the coherent radiation. A semiconductor structure of this type may be formed for example in accordance with an edge emitting laser or a semiconductor component with a vertical emission direction, such as, for instance, a VCSEL (Vertical Cavity Surface Emitting Laser) or a VECSEL (Vertical External Cavity Surface Emitting Laser). The components mentioned can generate coherent radiation by way of induced emission (stimulated emission), which radiation may have a high intensity.

The second active zone is preferably formed in an LED structure for generating incoherent radiation from spontaneous emission, which can be produced simply in a known manner. The production costs for a semiconductor component with an LED structure and a semiconductor structure of the type mentioned above may thus advantageously be kept low, such as, for instance, by monolithic integration of the LED structure into the semiconductor body, the LED structure being grown epitaxially on the semiconductor structure.

The semiconductor structure furthermore preferably contains at least one III-V semiconductor material, comprising $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$. The LED structure may also contain one of these materials.

In a second preferred refinement of the invention, the second active zone is arranged above the first active zone in such a way that the second active zone is arranged in the beam path of the radiation having the wavelength $\lambda_1$. In order to avoid a disadvantageous absorption of the radiation having the wavelength $\lambda_1$ in the second active zone, $\lambda_1$ is particularly preferably greater than $\lambda_2$, which can be achieved by suitable formation of the respective active zones.

The wavelength $\lambda_2$ preferably lies in the visible spectral range. This may be advantageous for example for visualizing the operating state of the coherent radiation. Furthermore, the visible incoherent radiation may serve for prealignment of the beam path or the main emission direction of the coherent radiation. The prealignment of the main emission direction of the coherent radiation may be facilitated particularly when the wavelength $\lambda_1$ lies in the non-visible spectral range. The visualization and/or the prealignment of the coherent radiation can thus advantageously be effected by means of the incoherent radiation and the human eye, with the result that complicated apparatuses for radiation detection can be dispensed with for prealignment.

For this purpose, the second active zone is preferably arranged in the beam path of the coherent radiation; the incoherent radiation particularly preferably has a comparatively high or a maximum intensity in a solid angle range encompassing the main emission direction of the coherent radiation, as a result of which a prealignment of the main emission direction of the coherent radiation can be facilitated more extensively. In this respect, the two active zones can advantageously already be formed in a suitable manner during the production of the radiation-emitting semiconductor component. In this case, the semiconductor body comprising the first active zone and the second active zone is preferably produced in monolithically integrated fashion, the second active zone preferably being grown epitaxially on the first active zone. During production, the emission characteristic of the radiation that can be generated in the second active zone can also be influenced to the effect that this incoherent radiation has a high, preferably maximum, intensity in the region of the main emission direction of the coherent radiation.

In a third preferred refinement of the invention, the first active zone and the second active zone are formed such that they are jointly electrically drivable, so that the generation of the coherent radiation is coupled to that of the incoherent radiation. This has the advantage that the operating state of the coherent radiation can be unambiguously determined by that of the incoherent radiation or the operating states correspond to one another.

This coupling can be achieved for example by means of a connecting layer that electrically conductively connects the first active zone to the second active zone, so that the two active zones of the component can be connected in series. The connecting layer preferably comprises a tunnel junction, which is particularly preferably integrated monolithically into the semiconductor body during the production of the semiconductor component. A tunnel junction of this type is preferably arranged between the first and second active zones and/or contains at least one layer having a higher charge carrier concentration, for example by virtue of high doping, than an adjoining layer of the same conduction type (p-conducting or n-conducting). Furthermore, the semiconductor component preferably has common electrical connections for the two active zones by means of which the active zones are driven jointly. Tunnel junctions are described in DE 100 576 98, the entire disclosure content of which is hereby explicitly incorporated in the present description.

In a fourth preferred refinement of the invention, the first active zone and the second active zone are formed such that they are electrically drivable separately from one another, with the result that the operating states of the coherent radiation and of the incoherent radiation can be decoupled from one another. The semiconductor component can thus emit radiation having the wavelengths $\lambda_1$ and/or $\lambda_2$. This is advantageous if, by way of example, the incoherent radiation is intended to be turned off during operation of the radiation-emitting semiconductor component, for instance in order to avoid disadvantageous influences of this radiation on measurements. Furthermore, a semiconductor component of this type may also be driven in such a way as to emit only incoherent radiation. Coherent radiation can be turned on, after which the component will emit both radiations so that the operating state of the coherent radiation is coupled to the operating state of incoherent radiation.

This may be achieved for example by means of a connecting layer that is preferably arranged between the two active zones and/or essentially electrically insulates the first active zone from the second active zone. For this purpose, a barrier junction is preferably formed in the connecting layer, which barrier junction, during operation of the component, at least greatly reduces current flow through the barrier, such as, by way of example, a blocking pn junction. The barrier junction is particularly preferably integrated monolithically into the semiconductor body during the production of the semiconductor component. In an advantageous manner, the barrier junction is already formed during the production of the semiconductor body and there is no need to produce any additional layers for forming the barrier junction in the semiconductor body.

Furthermore, in the case of this refinement, the semiconductor body preferably has separate electrical connections for the two active zones in order to enable the separate driving thereof.

DETAILED DESCRIPTION OF THE DRAWINGS

Elements that are of the same kind and act identically are provided with the same reference symbols in the figures.

Figure 1:
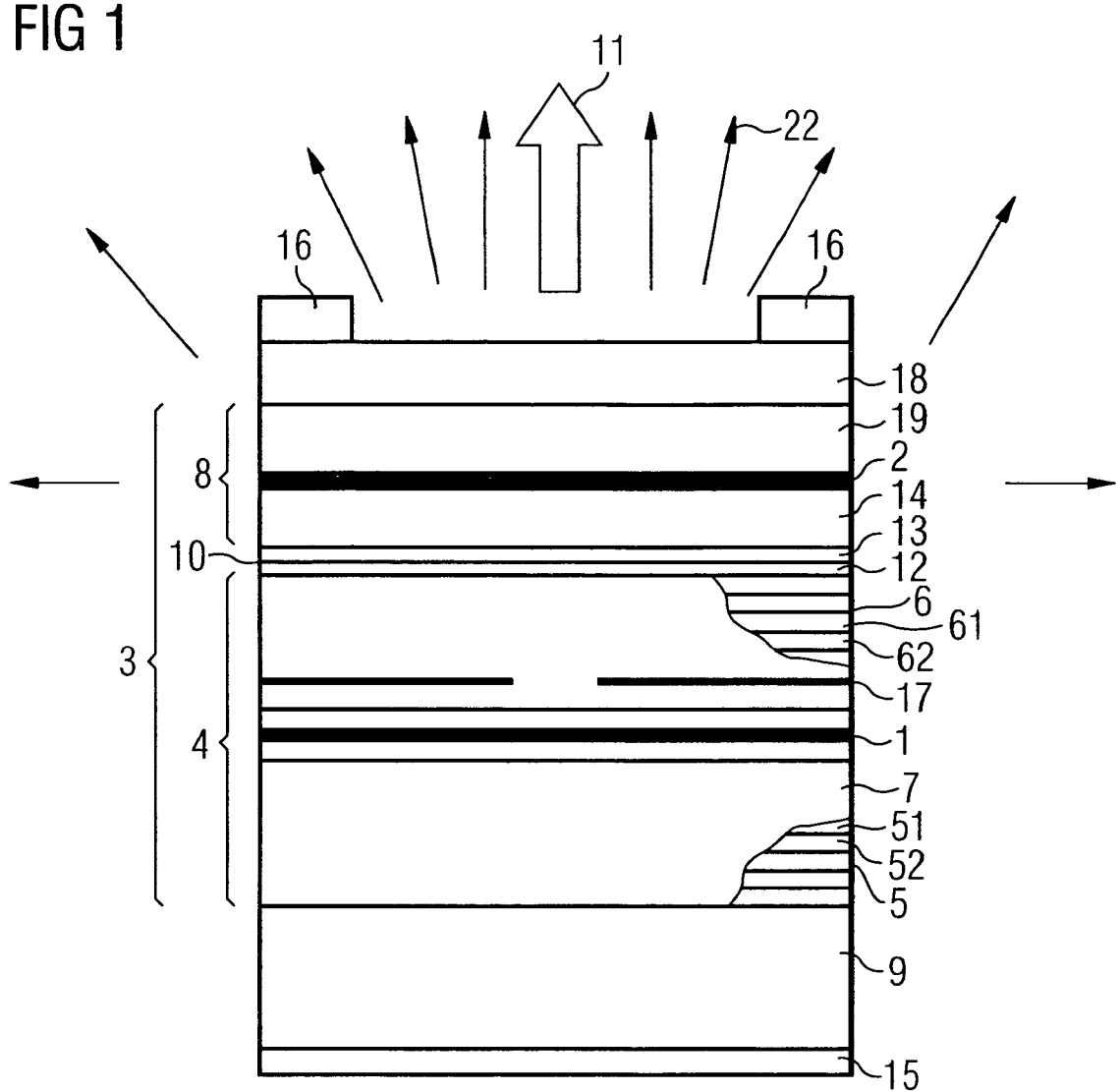
FIG. 1 shows a schematic sectional view of a first exemplary embodiment of a radiation-emitting semiconductor component according to the invention.

FIG. 1 illustrates a schematic sectional view of a first exemplary embodiment of a radiation-emitting semiconductor component according to the invention.

A semiconductor body 3 comprises a first active zone 1 and a second active zone 2, the first active zone generating coherent radiation 11 having a wavelength $\lambda_1$ and the second active zone generating incoherent radiation 22 having a wavelength $\lambda_2$. In this exemplary embodiment, the first active zone 1 is formed in a laser structure 4 corresponding to a VCSEL. A first, preferably n-conducting, mirror 5 and a second, preferably p-conducting, mirror 6, which, by way of example, are in each case formed as Bragg mirrors and have a plurality of schematically illustrated semiconductor layer pairs 51, 52 and 61, 62, respectively, having different refractive indices, form an optical resonator 7 for the radiation 11 generated in the first active zone. The reflectivity of the first mirror 5 is preferably greater than that of the second mirror 6, which serves as a coupling-out mirror for the radiation 11 from the laser structure 4. Typical reflectivities of the resonator mirrors for VCSELs may be above 98%.

The second active zone 2 is arranged in an LED structure 8. The wavelength $\lambda_1$ is preferably greater than the wavelength $\lambda_2$ in order to avoid a disadvantageous absorption of the radiation having the wavelength $\lambda_1$ in the second active zone 2. $\lambda_1$ particularly preferably lies in the non-visible spectral range, for example the infrared range, and the wavelength $\lambda_2$ particularly preferably lies in the visible, for example the yellow to red, spectral range.

Wavelengths of this type may be realized for example in the material system $In_xGa_yAl_{1-x-y}P$ or $In_xGa_yAl_{1-x-y}As$, in each case where $0 \leq x \leq 1$, $0 \leq y \leq 1$ and $x+y \leq 1$, on which the LED structure 8 and/or the laser structure 4 are preferably based. As is apparent from the textbook "Physics of Semiconductor Devices", Second Edition by S. M. Sze, chapter 12.4, InAlGaAs is particularly suitable for the laser structure, and InGaAlP for the LED structure.

The LED structure 8 is grown epitaxially on the laser structure 4, which is in turn produced epitaxially on a growth substrate 9, for example containing n-conducting GaAs. The semiconductor body 3 is thus formed in monolithically integrated fashion.

In FIG. 1, the main emission direction of the coherent radiation is illustrated by the arrow 11 and the emission directions of the incoherent radiation are illustrated by the arrows 22. The incoherent radiation radiates in a greater solid angle range than the coherent radiation and can thus be detected in a solid angle range outside the main emission direction of the coherent radiation 11 in a simplified manner compared with the latter. In particular, the incoherent radiation, as can be seen from FIG. 1, is also emitted in the lateral direction. In the region around the main emission direction of the coherent radiation 11, the incoherent radiation 22 advantageously has a high intensity (such as at the central region of the semiconductor chip) in order to facilitate the prealignment of the main emission direction of the coherent radiation 11. This can particularly advantageously be realized as early as during the production of the monolithically integrated semiconductor body.

The prealignment of the main emission direction of the coherent radiation to the direction of the incoherent radiation can be achieved by the current flow being guided in the semiconductor body shown in FIG. 1, for example. Because of the current restriction layer 17 and of the conductivity being rather low in the lateral direction, most electrons and holes will recombine in the central region of the semiconductor body. Hence it is a consequence of the formation of the semiconductor body that in a central region of the active region of the LED structure more radiation is generated than in the edge regions.

On the part of the second mirror 6, the laser structure 4 is electrically conductively connected to the LED structure 8 via a connecting layer 10, which preferably contains a tunnel junction. The tunnel junction preferably comprises at least two semiconductor layers 12 and 13 of different conduction types. On the part of the first active zone 1, there is arranged in this exemplary embodiment a p-conducting layer 12, which has a higher charge carrier concentration ($p^+$) than the layer which adjoins on the side of the first active zone and is provided here by the p-conducting second mirror 6. On the part of the second active zone 2, there is arranged an n-conducting layer 13, which, by virtue of high doping, has a higher charge carrier concentration ($n^+$) than an n-conducting layer which, on the part of the LED structure 8, adjoins the latter and is provided here for example by an n-conducting waveguide layer 14 formed in the LED structure. A tunnel junction of this type is preferably formed such that it is integrated monolithically in the semiconductor body.

The LED structure 8 and the laser structure 4 are electrically conductively connected via the tunnel junction 10. The first and second active zones may be operated as connected in series via an n-type contact 15 and a p-type contact 16. The active zones 1, 2 are jointly drivable via the contacts 15, 16 and the operating states of the coherent radiation 11 and of the incoherent radiation 22 correspond, so that the component emits both incoherent and coherent radiation during regular operation. The incoherent radiation is coupled to the operating state of the coherent radiation and can be used as monitor for said operating state. In this case, the wavelength $\lambda_2$ particularly preferably lies in the red spectral range since red light is distinguished by a high signaling effect, particularly on a human observer, and is therefore particularly suitable for the indication of a coherent, for example infrared, laser radiation that is present.

The LED structure generating visible radiation may accordingly be used as monitor LED for the operating state of a non-visible laser radiation, for example that of an infrared laser, in which case both the monitor LED and the laser can be monolithically integrated in a semiconductor body or semiconductor chip. The emission characteristic of the LED structure can also be influenced during the production of the semiconductor body, such as with waveguide layers 14 and 19 (as explained below). A monitor LED is coupled to the operating state of a non-visible laser radiation in conventional apparatuses as well. However, said monitor LED is not formed with the laser in a common semiconductor body, but rather is arranged outside the laser structure. Thus, the monitor LED and the laser are two separate components that are appropriately connected or driven such that the monitor LED can indicate the operating state of the laser. For prealignment purposes, the emission characteristic of a monitor LED of this type has to be coordinated with that of the laser radiation in a complicated manner. In the case of the invention, however, this can advantageously already be done during the production of the semiconductor body.

In order to configure the radiation generation in the first active zone as effectively as possible, a current constriction layer 17 is arranged in the laser structure 4, preferably in the second mirror 6, and determines the region of the first active zone which is provided for radiation generation. An opening in the current constriction layer 17, which is arranged above the region of the active zone which is provided for radiation generation, determines said region. The current constriction layer 17 may be produced for example by means of targeted oxidation of a material present in the laser structure. For this purpose, by way of example, the proportion of readily oxidizing material in the laser structure, such as Al, for instance, may be increased in the region in which the current constriction layer is intended to be provided compared with the rest of the laser structure in such a way as to facilitate an oxidation in this region, which may lead to the formation of a current constriction layer of the type illustrated in FIG. 1. The current constriction layer preferably has a lower conductivity compared with the remainder of the laser structure, so that the radiation generation is essentially effected in the region of the first active zone which is arranged below the opening. In particular, this means that less radiation is generated in the lateral edge regions of the first active zone and the generation of coherent radiation in the first active zone is advantageously facilitated or configured more efficiently.

The p-type contact 16 has a cutout in the central region in order to avoid absorption of the radiations generated by the active zones in the material of the p-type contact. By way of example, the p-type contact, just like the n-type contact 15, contains a metal, for instance Au. A current expansion layer 18 arranged on a p-conducting waveguide layer 19 of the LED structure 8 provides for a homogeneous impressing of current from the p-type contact 16 into the second active zone 2. The efficiency of the radiation generation, in particular in the second active zone, is thus advantageously increased.

Said current expansion layer is preferably formed such that it is radiation-transmissive. The current expansion layer particularly preferably contains a TCO material (Transparent Conducting Oxide), such as, for example, ZnO, an ITO, or similar materials. TCO materials are distinguished by high radiation transmissivity over a wide wavelength range in conjunction with high electrical conductivity, in particular in the lateral direction. ZnO for example is particularly suitable for electrical contact with p-conducting material, in particular containing a semiconductor material from the material system $In_xGa_yAl_{1-x-y}P$, and may form a, preferably ohmic, electrical contact with p-conducting material.

The waveguide layers 14 and 19 are preferably formed such that they guide the radiation 22 generated in the second active zone, in particular also in the lateral direction, in such a way that a smallest possible proportion of said radiation is emitted in the direction of the first active zone. As a result, the absorption of the incoherent radiation having the wavelength $\lambda_2$ in the first active zone is advantageously reduced. Particularly preferably, the incoherent radiation is thus also emitted to an increased extent (as compared to a structure having no waveguide layers) in the horizontal or lateral direction— essentially perpendicular to the vertical main emission direction of the coherent laser radiation 11 from the laser structure 4—and the solid angle range in which the incoherent radiation can be detected in a simplified manner by an observer is thus advantageously increased.

If the LED structure is intended to be used for prealignment of the main emission direction of the coherent radiation, then it is possible to dispense with the waveguide layers in order not to unnecessarily attenuate the intensity of the incoherent radiation along the main emission direction of the coherent radiation at the expense of the intensity in the lateral direction.

Figure 2:
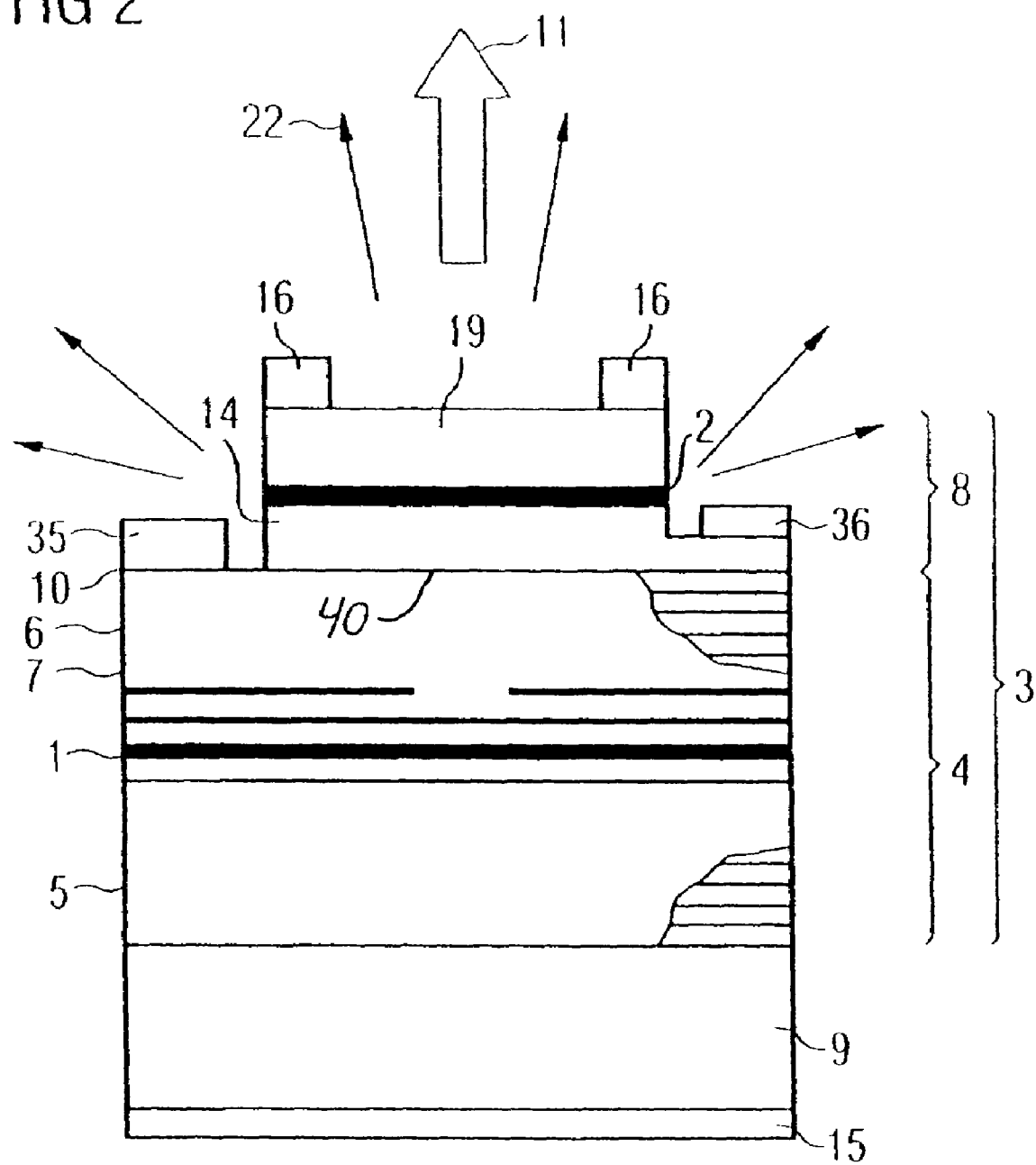
FIG. 2 shows a schematic sectional view of a second exemplary embodiment of a radiation-emitting semiconductor component according to the invention.

FIG. 2 illustrates a schematic sectional view of a second exemplary embodiment of a radiation-emitting semiconductor component according to the invention.

The radiation-emitting semiconductor component shown in FIG. 2 essentially corresponds to the semiconductor component illustrated in FIG. 1.

The semiconductor body 3 comprises a laser structure 4 formed in accordance with a VCSEL with an optical resonator 7 formed by the n- and p-conducting mirrors 5 and 6, respectively. A first active zone 1 is formed in the laser structure, which active zone can generate coherent radiation 11 having the wavelength $\lambda_1$ in the vertical direction. Arranged above the laser structure in an LED structure 8 is a second active zone 2, which can generate incoherent radiation 22 having the wavelength $\lambda_2$, which is emitted in a greater solid angle range compared with the main radiating direction of the coherent radiation. The LED structure 8 comprises n- and p-conducting waveguide layers 14 and 19, respectively, which guide the incoherent radiation to an increased extent in the lateral direction. The semiconductor body 3, comprising the LED structure and the laser structure, is preferably formed in monolithically integrated fashion by means of epitaxial growth. The laser structure 4 is firstly grown epitaxially on the growth substrate 9. Afterward, the LED structure may be grown epitaxially on the laser structure.

In contrast to the semiconductor component illustrated in FIG. 1, the semiconductor component shown in FIG. 2 has separate connections for making contact with the first active zone and the second active zone. The first active zone 1 can be electrically connected via the p-type contact 35 arranged on the second mirror 6 and the n-type contact 15, while the second active zone 2 can be electrically connected via the p-type contact 16 and the n-type contact 36.

The LED structure 8 is connected to the laser structure 4 via a connecting layer 10 comprising a barrier junction 40, which, in this exemplary embodiment, is embodied as a pn junction between the p-conducting second mirror 6 and the n-conducting waveguide layer 14 and/or may be monolithically integrated in some other way in the semiconductor body 3. The barrier junction 40 effects blocking with regard to a joint contact-connection of the two active zones via the contacts 15 and 16, with the result that a joint contact-connection as in FIG. 1 is at least made considerably more difficult and a separate driving of the first and second active zones is made possible.

In this exemplary embodiment, the second active zone has a smaller lateral extent than the first active zone, thereby advantageously enabling or facilitating the formation of the contacts 35 and 36 on the second mirror 6 and the waveguide 14, respectively. Between the LED structure 8 and the p-type contact 35 of the laser structure 4, an interspace is preferably provided in the lateral direction, which prevents a short circuit. The n-type contact 36 of the LED structure 8 is arranged on a projection of the n-conducting waveguide 14, the waveguide 14 having a lateral extent that is advantageously greater than that of the second active zone but less than that of the first active zone.

Such a patterning of the semiconductor body 3, in particular of the LED structure 8, may be effected for example by means of masking and etching processes. The patterning may advantageously be carried out after the semiconductor body has been formed in a monolithically integrated manner.

Consequently, in this exemplary embodiment, the second active zone in the LED structure and the first active zone in the laser structure can be operated separately, for which reason the radiation-emitting semiconductor component can emit radiation having the wavelengths $\lambda_1$ and/or $\lambda_2$, the generation of which can be controlled via separate connections.

In a departure from the exemplary embodiments illustrated in FIGS. 1 and 2, the first active zone and the second active zone may also be driven via a common n-type contact and separate p-type contacts. This corresponds to the contact structure illustrated in FIG. 2 with the n-type contact 36 being dispensed with. In this case, the connecting layer electrically conductively connects the active zones, preferably via a tunnel junction as in FIG. 1. During operation, the radiation-emitting semiconductor component thus formed emits coherent radiation with respect to which the incoherent radiation can be turned on. The turning on may be effected via the separate p-type contacts for the first and second active zones. If contact-connection is effected on the p side via the p-type contact 16 of the LED structure, then the component emits both coherent and incoherent radiation, while only coherent radiation is generated in the case of p-side contact-connection via the p-type contact 35 of the laser structure 4.

It should be noted that the growth substrate 9 of the laser structure 4 can also be stripped away and replaced by a suitable carrier during the production of the semiconductor component or the semiconductor body. Said carrier advantageously has a high thermal conductivity for dissipating the heat arising in the semiconductor body and/or a high electrical conductivity for electrical contact-connection of the semiconductor body via the carrier.

It should also be noted that layer 18 shown in FIG. 1 can also be formed between contact 16 and layer 19 in the embodiment of FIG. 2.

The table provided below provides exemplary constituents and conductivity types for the layers discussed above.

Constituents and Conductivity Type of the
Embodiment Shown in FIG. 1

| Layer | Constitution | Conductivity type |
|---|---|---|
| 9 | GaAs | n |
| 51 | $Al_{0.2}Ga_{0.8}As$ | n |
| 52 | $Al_{0.9}Ga_{0.1}As$ | n |
| 1 | $Al_{0.25}Ga_{0.75}As$ | Intrinsic |
|   | GaAs | |
|   | $Al_{0.25}Ga_{0.75}As$ | |
|   | GaAs | |
|   | $Al_{0.25}Ga_{0.75}As$ | |
|   | GaAs | |
|   | $Al_{0.25}Ga_{0.75}As$ | |
|   | (Multiple Quantum Well structure: 3 wells) | |
| 62 | $Al_{0.9}Ga_{0.1}As$ | p |
| 61 | $Al_{0.2}Ga_{0.8}As$ | p |
| 17 | AlAs or $Al_{0.8}Ga_{0.2}As$ | p |
| 12 | GaAs | $p^+$ |
| 13 | GaAs | $n^+$ |
| 14 | $Al_{0.5}Ga_{0.5}As$, layer 14a | n |
|   | $Al_{0.8}Ga_{0.2}As$, layer 14b | n |
|   | $In_{0.5}Al_{0.5}P$, layer 14c | n |
| 2 | $In_{0.5}(Ga_{0.5}Al_{0.5})_{0.5}P$ | Intrinsic |
|   | $In_{0.5}(Ga_{0.9}Al_{0.1})_{0.5}P$ | |
|   | $In_{0.5}(Ga_{0.5}Al_{0.5})_{0.5}P$ | |
|   | $In_{0.5}(Ga_{0.9}Al_{0.1})_{0.5}P$ | |
|   | $In_{0.5}(Ga_{0.5}Al_{0.5})_{0.5}P$ | |
|   | $In_{0.5}(Ga_{0.9}Al_{0.1})_{0.5}P$ | |
|   | $In_{0.5}(Ga_{0.5}Al_{0.5})_{0.5}P$ | |
|   | $In_{0.5}(Ga_{0.9}Al_{0.1})_{0.5}P$ | |
|   | $In_{0.5}(Ga_{0.5}Al_{0.5})_{0.5}P$ | |
|   | $In_{0.5}(Ga_{0.9}Al_{0.1})_{0.5}P$ | |
|   | $In_{0.5}(Ga_{0.5}Al_{0.5})_{0.5}P$ | |
|   | (Multiple Quantum Well structure: 5 wells) | |
| 19 | $In_{0.5}Al_{0.5}P$, layer 16c | p |
|   | $Al_{0.8}Ga_{0.2}As$, layer 16b | p |
|   | $Al_{0.5}Ga_{0.5}As$, layer 16a | p |
| 18 | GaAs or ZnO | p |

For Mirror 5: e.g. 30 pairs of 51.52
For Mirror 6: e.g. 21 pairs of 61.62 (preferably layer 17 is formed near the active region 1, particularly preferably after the first pair 61.62 of mirror 6)
$p^+$: Dopant concentration is greater than the one of the adjoining p-type layer
$n^+$: Dopant concentration is greater than the one of the adjoining n-type layer The semiconductor body can be formed by epitaxial growth, such as MOVPE (Metal Organic Vapor Phase Epitaxy). The growth sequence is in accordance with the table presented above, proceeding from the top to the bottom beginning with the formation of layer 51 over the growth substrate 9, for the embodiment of FIG. 1. The embodiment of FIG. 2 can be similarly formed.

The scope of protection of the invention is not limited to the examples given herein above. The invention is embodied in each novel characteristic and each combination of characteristics, which particularly includes every combination of any features which are stated in the claims, even if this feature or this combination of features is not explicitly stated in the claims or in the examples.

We claim:

1. A radiation-emitting semiconductor component, comprising:
a semiconductor body with a first active zone and a second active zone arranged downstream of the first active zone in the vertical direction, the first active zone being provided for generating a radiation having a first wavelength $\lambda_1$ and the second active zone being provided for generating a radiation having a second wavelength $\lambda_2$,
wherein the radiation having the first wavelength $\lambda_1$ is coherent and the radiation having the second wavelength $\lambda_2$ is incoherent, and
wherein the first active zone and the second active zone are each electrically driven, the first active zone and the second active zone are monolithically integrated into the semiconductor body, the first active zone is formed in a semiconductor structure comprising an optical resonator, and the second active zone is arranged on the semiconductor structure.

2. The radiation-emitting semiconductor component as claimed in claim 1, wherein the second active zone is arranged in the beam path of the radiation having the wavelength $\lambda_1$.

3. The radiation-emitting semiconductor component as claimed in claim 1, wherein the wavelength $\lambda_1$ is greater than the wavelength $\lambda_2$.

4. The radiation-emitting semiconductor component as claimed in claim 1, wherein the wavelength $\lambda_1$ lies in the non-visible spectral range.

5. The radiation-emitting semiconductor component as claimed in claim 1, wherein the wavelength $\lambda_2$ lies in the visible spectral range.

6. The radiation-emitting semiconductor component as claimed in claim 1, wherein the semiconductor structure is formed in accordance with a semiconductor component with a vertical emission direction, in particular a vertically emitting laser.

7. The radiation-emitting semiconductor component as claimed in claim 1, wherein the second active zone is formed in an LED structure.

8. The radiation-emitting semiconductor component as claimed in claim 1, wherein the second active zone is formed in an LED structure.

9. The radiation-emitting semiconductor component as claimed in claim 8, wherein the LED structure is electrically conductively connected to the semiconductor structure via a connecting layer.

10. The radiation-emitting semiconductor component as claimed in claim 9, wherein the connecting layer comprises a tunnel junction that electrically conductively connects the LED structure and the semiconductor structure.

11. The radiation-emitting semiconductor component as claimed in claim 1, wherein the first and second active zones are formed such that they are jointly electrically drivable.

12. The radiation-emitting semiconductor component as claimed in claim 9, wherein the first and second active zones are formed such that they are jointly electrically drivable.

13. The radiation-emitting semiconductor component as claimed in claim 9, wherein the connecting layer comprises a barrier junction that electrically insulates the LED structure from the semiconductor structure.

14. The radiation-emitting semiconductor component as claimed in claim 12, wherein the connecting layer comprises a barrier junction that electrically insulates the LED structure from the semiconductor structure.

15. The radiation-emitting semiconductor component as claimed in claim 1, wherein the first and second active zones are formed such that they are electrically drivable separately from one another.

16. The radiation-emitting semiconductor component as claimed in claim 9, wherein the first and second active zones are formed such that they are electrically drivable separately from one another.

17. The radiation-emitting semiconductor component as claimed in claim 1, wherein the radiation-emitting semiconductor component comprises at least two electric contacts, two of the at least two electric contacts being disposed on opposite sides of the first active zone.

18. The radiation-emitting semiconductor component as claimed in claim 1, wherein the first active zone and the second active zone are electrically connected in series.

19. The radiation-emitting semiconductor component as claimed in claim 1, wherein the first active zone and the second active zone are electrically drivable separately from one another.

20. The radiation-emitting semiconductor component as claimed in claim 1, wherein the semiconductor body comprises at least one of $In_xGa_yAl_{1-x-y}As$ and $In_xGa_yAl_{1-x-y}P$, in each case where $0 \leq x \leq 1$, $0 \leq y \leq 1$, and $x+y \leq 1$.

21. The radiation-emitting semiconductor component as claimed in claim 8, wherein the LED structure comprises n-conducting and p-conducting waveguide layers that guide the incoherent radiation to an increased extent in the lateral direction.

22. The radiation-emitting semiconductor component as claimed in claim 1, wherein the first active zone is formed in a laser structure comprising an n-conducting and a p-conducting mirror, the first active zone being arranged between said n-conducting mirror and said p-conducting mirror.

* * * * *